(12) United States Patent
Chen

(10) Patent No.: US 6,909,627 B2
(45) Date of Patent: Jun. 21, 2005

(54) APPARATUS TURNING ON WORD LINE DECODER BY REFERENCE BIT LINE EQUALIZATION

(75) Inventor: Chung-Zen Chen, Hsinchu (TW)

(73) Assignee: Elite Semiconductor Memory Technology Inc., Hsin-Chu (TW)

( * ) Notice: Subject to any disclaimer, the term of this patent is extended or adjusted under 35 U.S.C. 154(b) by 0 days.

(21) Appl. No.: 10/640,388

(22) Filed: Aug. 14, 2003

(65) Prior Publication Data

US 2005/0036360 A1 Feb. 17, 2005

(51) Int. Cl.[7] .............................................. G11C 11/00
(52) U.S. Cl. ....................................... 365/154; 365/203
(58) Field of Search ................................... 365/154, 203

(56) References Cited

U.S. PATENT DOCUMENTS 5,841,716 A * 11/1998 Iwaki .......................... 365/203

* cited by examiner

Primary Examiner—M. Tran
(74) Attorney, Agent, or Firm—Birch, Stewart, Kolasch & Birch, LLP (57) ABSTRACT

A memory comprising a memory array, a plurality of word lines, a plurality of bit lines, a word line decoder, an equalizer and an equalization control apparatus is provided to meet the requirement of the completion of bit line equalization prior to the turn on of word lines. The memory array is arranged in columns and rows. The word lines are connected to the rows of the memory array. The bit lines connected to the columns of the memory array. The word line decoder is connected to the word lines for selecting one of the word lines. The equalizer is connected to the bit lines for equalizing the bit lines to a desired voltage. The equalization control apparatus serves for monitoring the equalizer to disable the word line decoder when the equalizer performs a equalization operation and enable the word line decoder when the equalization operation is completed.

15 Claims, 7 Drawing Sheets

APPARATUS TURNING ON WORD LINE DECODER BY REFERENCE BIT LINE EQUALIZATION

BACKGROUND OF THE INVENTION

1. Field of the Invention

The present invention relates to an apparatus for controlling a word line decoder, more particularly to an apparatus that turns on the word line decoder by monitoring the reference bit line equalization.

2. Description of the Prior Art

In static random access memory (SRAM), each SRAM cell couples to a bit line (BL) and a bit line bar (BL'). Before the cell performs read or write cycle, the BL and the associated BL' of the SRAM cell must be equalized, i.e., the voltages of BL and the BL' must be pulled to same voltage level and this voltage level must be above flip voltage of the SRAM cell. Thus, writing error data to the cell due to wrong timing can be avoided.

Figure 1:
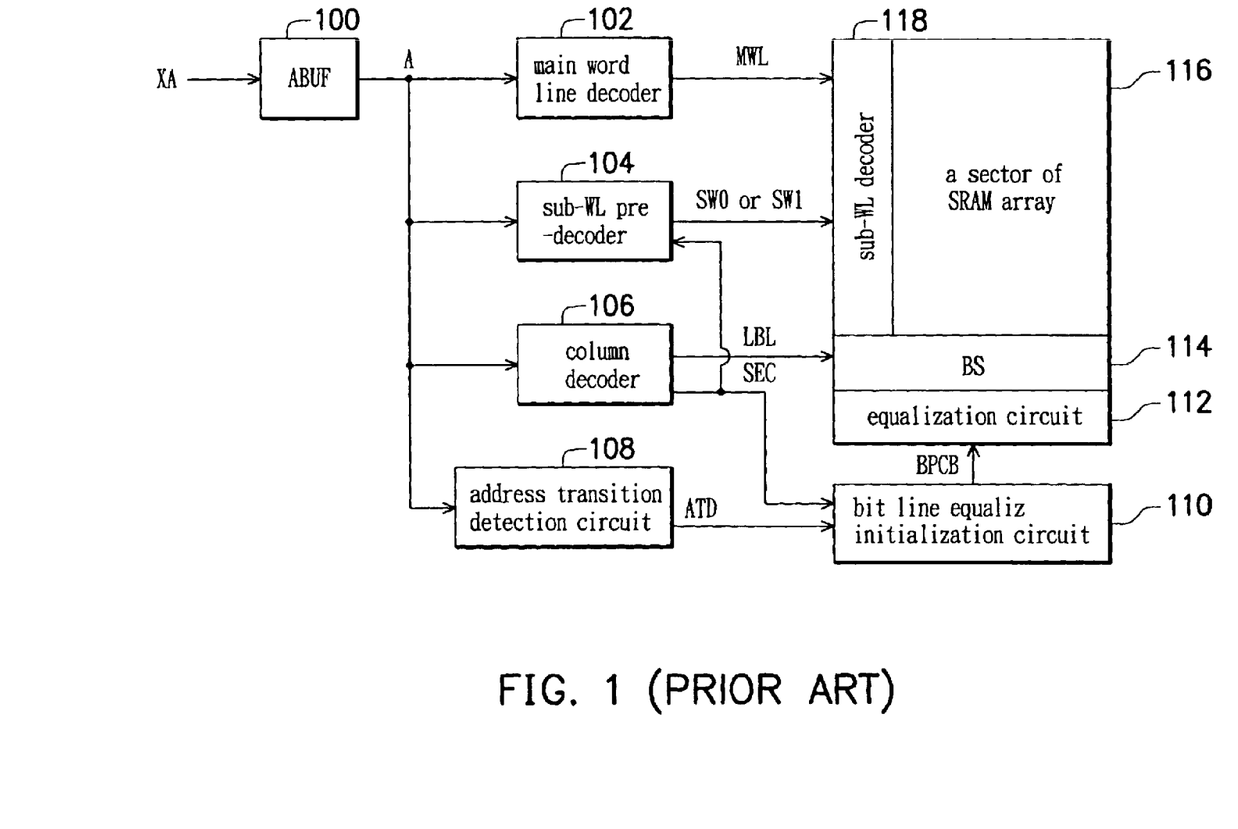
FIG. 1 is a block diagram of the circuit of a conventional asynchronous SRAM.
Figure 2:
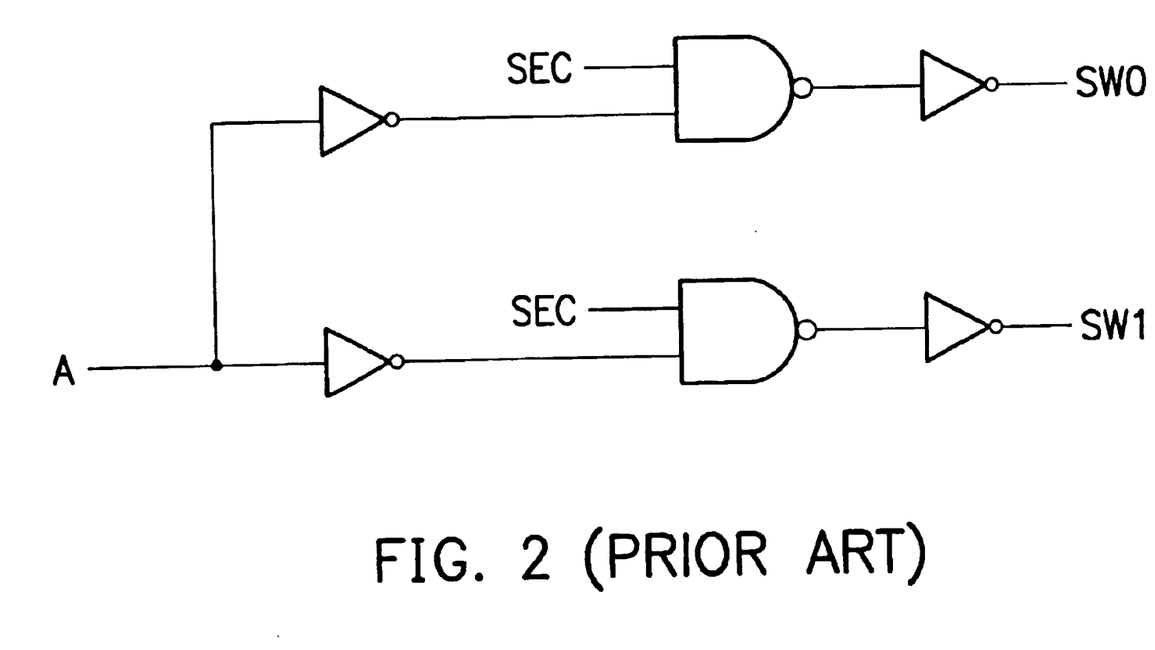
FIG. 2 is part of the controlling circuit of a conventional asynchronous SRAM.

FIG. 1 is a block diagram of a conventional asynchronous SRAM circuit. The SRAM cell array is divided into many sections to speed up the cell access speed. Here a section of cell array is illustrated. ABUF 100 is an address buffer for latching an external address XA to generate an address A internally used in a chip. address A includes two major parts; one is named word line address, the other is named bit line address. Main word line (MWL) decoder 102 and Sub-WL pre-decoder 104 receives word line address to generate MWL, sw0, and sw1 after decoding. One of the sw0 and sw1, and MWL will be decoded at sub-WL decoder 118 to excite a selected word line of a selected section. Column decoder 106 includes a section selector and a bit line address decoder to generate section enable signal (SEC) and bit switch (BS) enable signal (LBL). SEC and LBL can enable BS to select a bit line pair (BL pair). SEC is also sent to the sub-WL pre-decoder 104 to enable the pre-decoder, as shown in FIG. 2. Address transition detection (ATD) circuit generates ATD signal when the address is toggled. ATD signal will trigger bit line (BL) equalization initiation circuit to activate BPCB signal, which turns on bit line equalization circuit 112. BL equalization is performed during the active duration of BPCB signal.

From above, it is clear that there must be a close timing relationship between the toggling of WL and equalization of BL. If WL turns on before the completion of BL equalization, wrong data will be written into the selected cell and thus produces error in data access. Therefore, this timing relationship must be avoided by circuit design. Synchronous SRAM also has the same design consideration.

In SRAM design, timing for turning on a selected word line is controlled, so that the timing for any word line to be turned on must be after the equalization of the bit lines. Thus, SRAM designer must find out the specific word lines that are turned on most quickly during decoding operation, and adequately adjust the timing of row decoder (main word line decoder 102 and sub-WL pre-decoder 104) to satisfy the above design requirement. But the above method not only delays the timing to turn on the fastest WL, but also the timing of the slowest WL. This increases the access time of the memory chip and causes speed loss. Furthermore, when designer does not find out the timing of the fastest WL correctly, the timing requirement may be violated. Process variation is another cause to violate this requirement.

U.S. Pat. No. 5,268,863 mentioned a method of assuring equalization of BL before WL turns on, but this patent is only suitable when the operation is switched from writing to reading. In U.S. Pat. No. 5,268,863 patent, the control signal WED corresponded to a write enable signal serves to control the turn-on of WL, thereby preventing problems that occur when address changes earlier than write enable. However, U.S. Pat. No. 5,268,863 does not handle the problem of timing from BL equalization to WL turn-on.

U.S. Pat. No. 5,343,432 uses a signal generated when WL turns on, and feeds this signal back to ATD to disable the pulses generated by ATD. Thus, the equalization time of BL can be shortened; hence the data access time can be shortened. However, this method still does not solve the problem of WL turning on before BL equalization.

SUMMARY OF THE INVENTION

According to this, the main object of the present invention is to provide an apparatus that uses a reference bit line (RBL) to turn on WL in SRAM. By using the equalization of the RBL to control the timing of the WL, the requirement of equalization of BL before turning-on of WL is satisfied.

According to the above objects, the present invention provides a memory comprising a memory array, a plurality of word lines, a plurality of bit lines, a word line decoder, an equalizer and an equalization control apparatus. The memory array is arranged in columns and rows. The word lines are connected to the rows of the memory array. The bit lines connected to the columns of the memory array. The word line decoder is connected to the word lines for selecting one of the word lines. The equalizer is connected to the bit lines for equalizing the bit lines to a desired voltage. The equalization control apparatus serves for monitoring the equalizer to disable the word line decoder when the equalizer performs an equalization, and enable the word line decoder when the equalization operation is completed.

The present invention can be applied to synchronous, asynchronous, low power, or high speed SRAM.

Since the present invention's strategy is to delay the WL that is turned on earliest without any influence to the WL that is turned on latest, the access time of the memory chip is not affected.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only and thus are not limitative off the present invention and wherein.

DETAILED DESCRIPTION OF THE INVENTION

Embodiment

Figure 3:
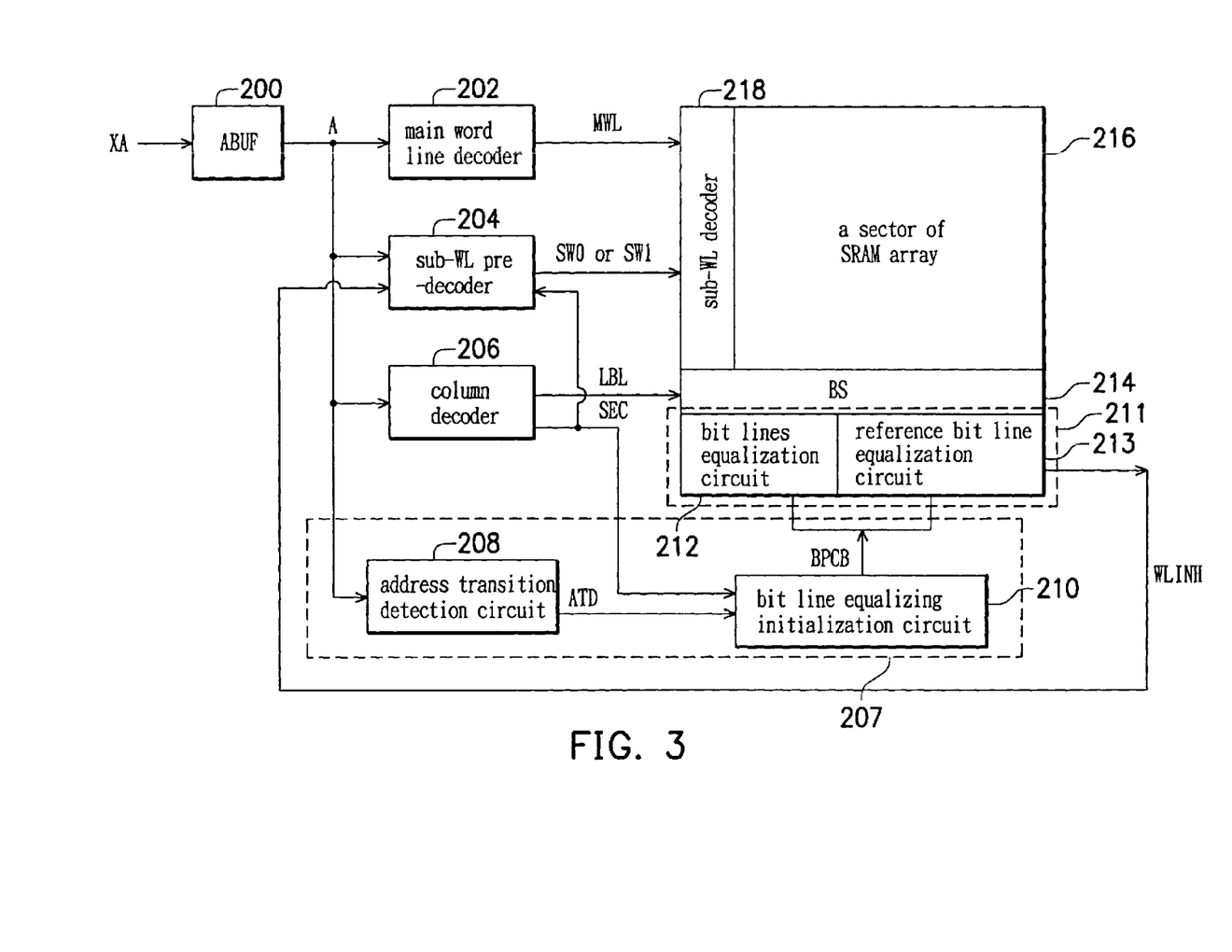
FIG. 3 is the block diagram of the system structure of the present invention.

The block diagram of the present invention is shown in FIG. 3. The reference bit line equalization circuit 213 controls WL pre-decoder 204. This control method can assure the timing requirement that the equalization of BL must be finished prior to the turning-on of WL. The present invention uses a reference bit line (RBL) equalization circuit 213 to provide a control signal to control the word line decoder when the memory cell performs equalization.

Referring to FIG. 3, the address A, generated by an address buffer 200 (ABUF), which latches an external address XA, is internally used in the memory chip. Address A selects, through row decoders (including WL decoder 202, sub-WL pre-decoder 204 and sub-WL decoder 218), a required word line, and selects, through column decoder 206, required bit line pairs (BL pairs). A portion of address A is associated with the word lines, and can be divided into two parts, a high bit part and a low bit part. The main word line decoder is used to decode the high bit part to generate a main word line signal. Sub-WL pre-decoder 204 is used to decode the low bit part in the selected section. According to the main word line signal and the SW0/SW1 from the Sub-WL decoder 204, one of the word lines in a selected section will be activated.

When address A toggles, address transition detection circuit 208 generates an ATD signal to bit line equalizing initialization circuit 210 to send out a BPCB control signal, such that BL equalization circuit 212 and RBL equalization circuit 213 are enabled. BL equalization circuit 212 performs the equalization of the bit line pairs upon receipt of the BPCB control signal. Upon receipt of the BPCB control signal, RBL equalization circuit 213 immediately sends a word line control signal (WLINH) to sub-WL pre-decoder 204 to disable the decoding operation of the row decoder until equalization is completed. In other words, RBL equalization circuit 213 monitors the process of bit line equalization, and enables the decoding operation of the row decoder while the completion of bit line equalization is detected.

The decoding operation of Main WL decoder 202 can be going on even sub-WL pre-decoder 204 is disabled due to the incompleteness of bit line equalization, so that MWL signal can be ready and waits the decoding of sub-WL decoder 218 of each section. Once sub-WL pre-decoder 204 is enabled, due to the completeness of the bit line equalization operation, it can perform sub-WL decoding and thus turns on the selected word line. Thus, timing skew between fastest turned on WL and slowest turned on WL is reduced.

Figure 4:
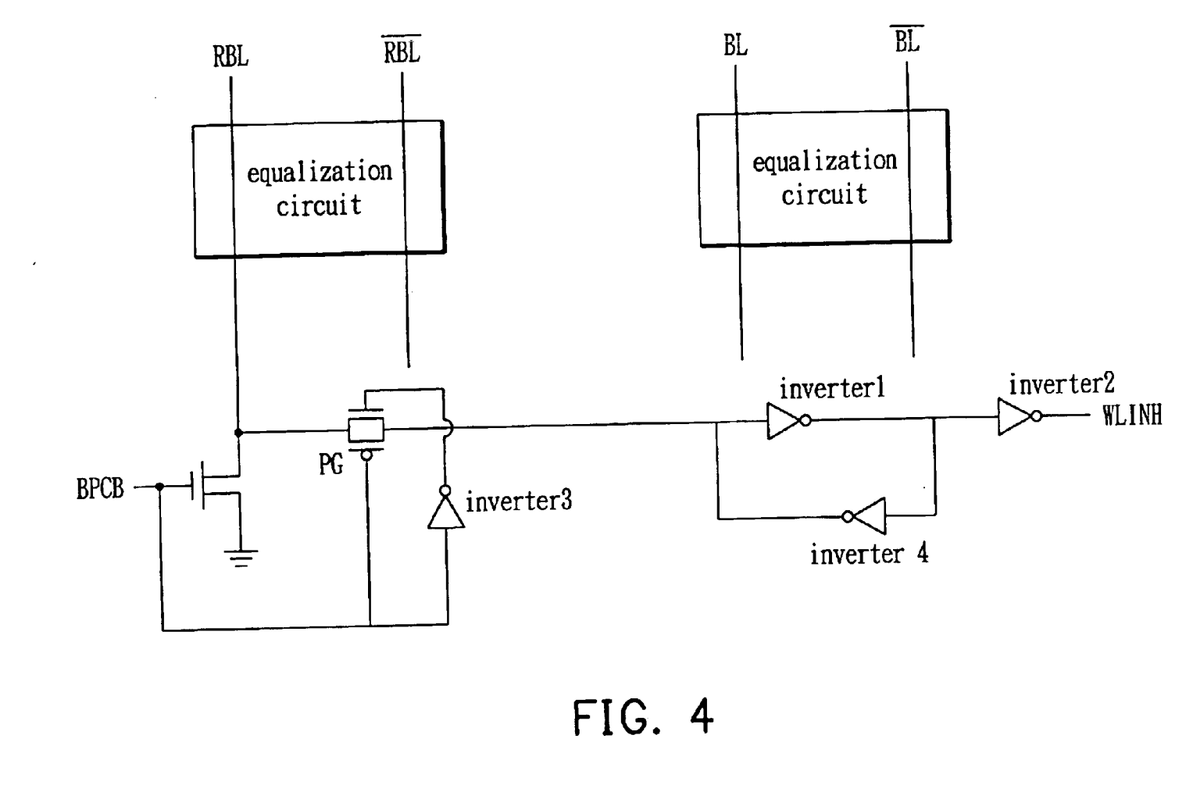
FIG. 4 is the actual circuit diagram of the RBL equalization circuit of the present invention.
Figure 5:
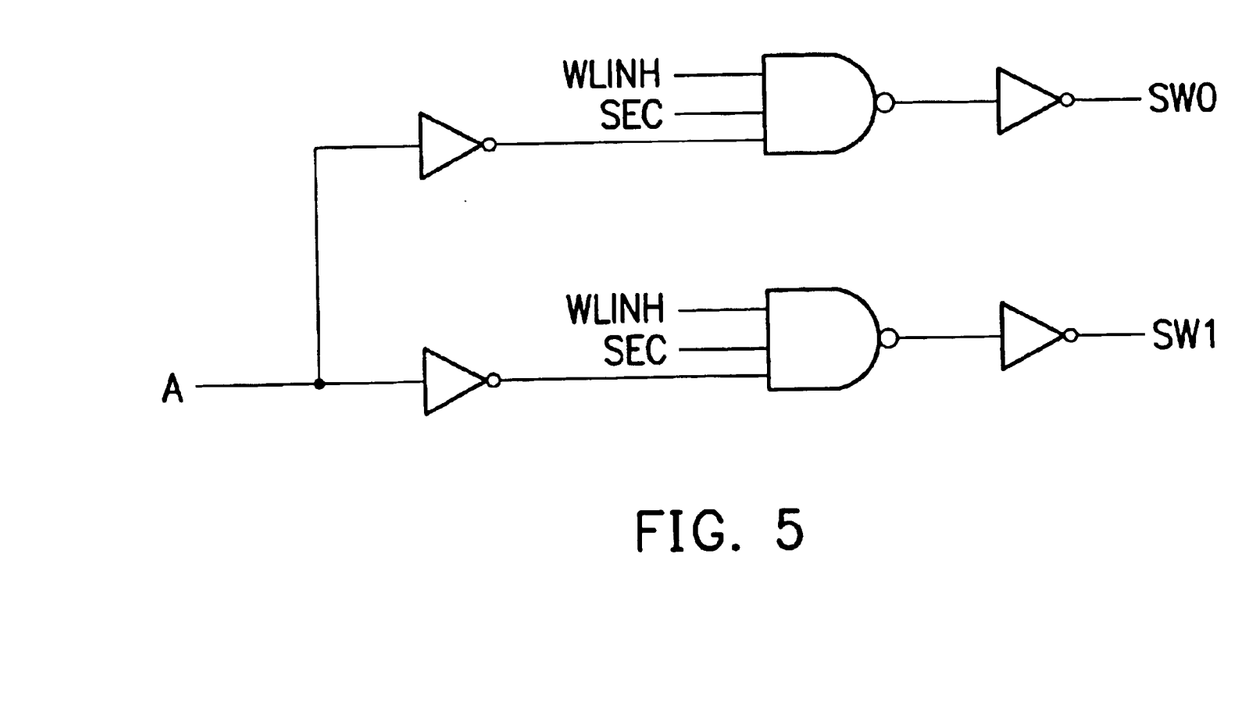
FIG. 5 is the circuit diagram of the combination logic of the control signals of the present invention.
Figure 6:
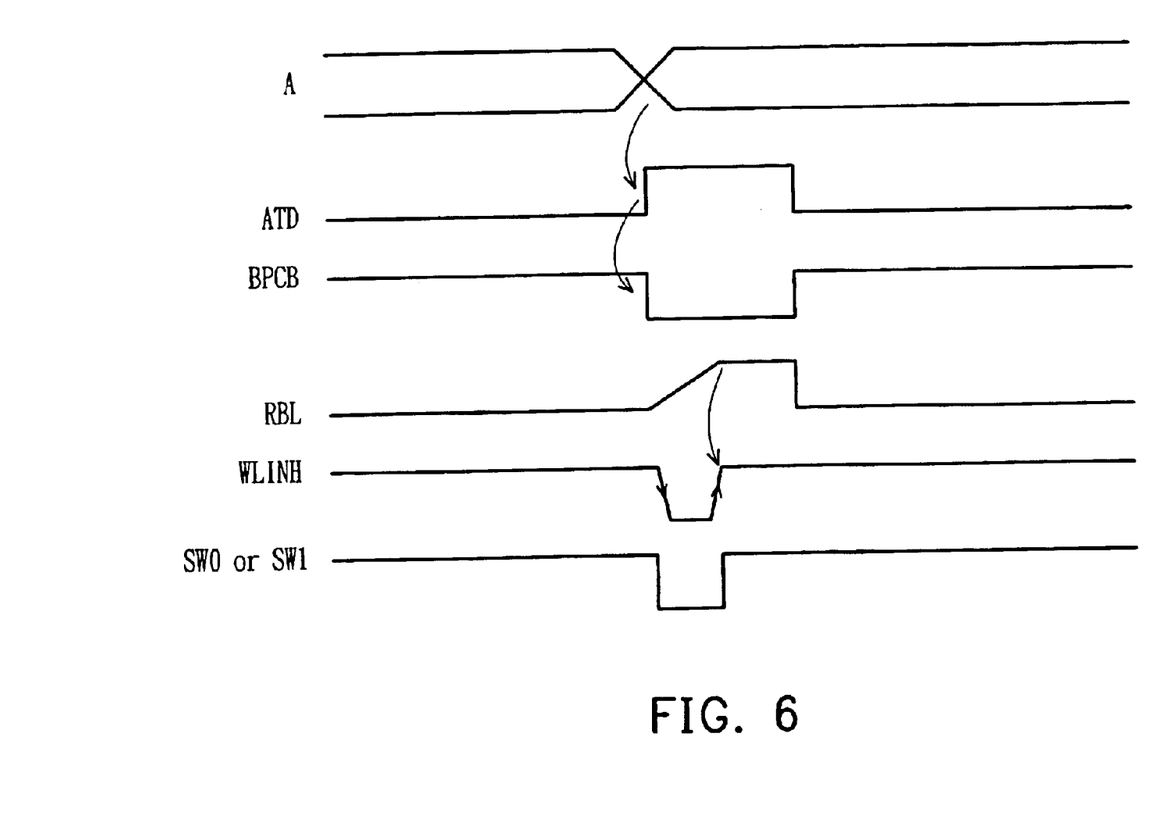
FIG. 6 is the timing diagram of the control signals of the present invention.

FIG. 4 is the schematic diagram of the circuit of RBL equalization circuit 213. The present invention uses this circuit to sense the voltage level at RBL, and generate control signal WLINH to control sub-WL pre-decoder 204, of which the combination logic circuit is as shown in FIG. 5. RBL must truly represent the electrical characteristic of each BL of memory array, therefore RBL and RBL' can be formed by adding one more pair of BL in the memory array, or by directly using dummy BL used to prevent proximity effect in the memory array. FIG. 5 is the combination logic circuit of sub-WL pre-decoder 204 when it decodes a bit of address A only. FIG. 6 is the timing diagram of the control signal of the present invention, the time interval and the logic level are not to the scale, only the timing relationship between some important signals are described here.

Referring to the timing of FIG. 6 and in conjunction with the circuits of FIGS. 3 to 5, when address A toggles, the address transition detection circuit 208 generates a positive pulsed ATD signal changed from logic 0 to logic 1. The SEC signal corresponded to a specific section is changed from logic 0 to logic 1 by column decoder 206. The rising edge of ATD pulse triggers bit line equalizing initialization circuit 210, so that BPCB signal is changed from logic 1 to logic 0. The falling edge of BPCB signal triggers BL equalization circuit 212, and turns on bit line equalization operation. The RBL is at low level when PBCB signal is at high level, i.e. the RBL is in a non-equalization state. Once BPCB is active, the input terminal of the inverter 1 senses logic 0, the output of the inverter 2 thus changes from logic 1 to logic 0, i.e., WLINH changes from logic 1 to logic 0. The falling edge of the WLINH signal disables the sub-WL pre-decoder 204. When WLINH signal is logic 0, sw0 and sw1 also become logic 0, so the sub-WL decoder 218 of the section corresponded is disabled.

Figure 7:
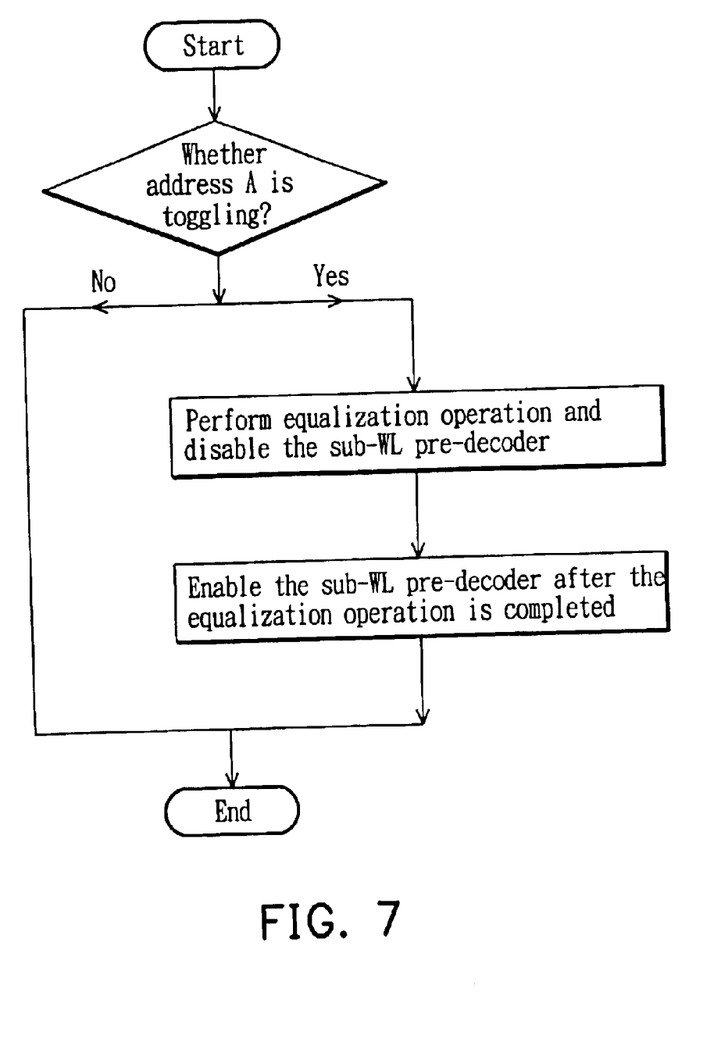
FIG. 7 is the flow chart of the control mechanism of the present invention.

As bit line equalization continues, the voltage level of RBL is raised. It will reach a certain level, so the input terminal of the inverter 1 senses logic 1, and the WLINH signal changes from logic 0 to logic 1. The rising edge of the WLINH signal represents the end of the equalization operation and the WL pre-decoder 204 is enabled. As shown in FIG. 5, sw0 or sw1 will change from logic 0 to logic 1, so that the sub-WL decoder 218 of a section corresponded is enabled. It should be noted that when transistor PG is turned off, meaning equalization operation ends, the input terminal of the inverter 1 is locked at high level. As described above, the control mechanism of the present invention is shown in the flow chart of FIG. 7.

To assure that the equalization of RBL represents the equalization of all BL, the equalization of RBL should be at the worst condition of the equalization of BL. For example, if the completion condition of the bit line equalization is that the voltage level of BL reaches a high level, VCC, the initial condition of the voltage level of RBL in performing the equalization should be the lowest voltage level, VSS. In contrast, if the completion condition of the bit line equalization is that the voltage of BL reaches a low level VSS, the initial condition of the voltage level of RBL in performing the equalization should be the highest voltage level, VCC.

The method of the present invention has the following advantages:

1. The circuit designer does not have to delay the turn-on time of WL. As long as the equalization is not finished, the word line decoding operation is blocked by the WLINH signal, and no word lines are activated. Thus, it can be assured that the timing to turn on a word line is later than the timing of the end of the BL equalization.

2. The timing relationship between the turning on of a WL and the equalization of BL is not affected by manufacturing process variation. The turning on time of WL is always later than the end of the equalization due to the control of sub-WL decoder by WLINH signal.

3. Data access time will be more certain. In designing the timing of the equalization, the timing for BL equalization to complete is made earlier than the timing of the earliest turning on WL. The timing of earliest WL is delayed by WLINH signal. Therefore, the timing difference between the latest WL and the earliest WL is shortened, i.e., the data access time is more certain.

From above mechanism, the present invention uses WLINH signal to disable or enable decoding circuit, assuring that no word lines are turned on during the bit line equalization, and reducing the timing difference to turn on the earliest WL and the latest WL. This invention can be applied to read and write cycle and can be implemented in synchronous, asynchronous, lower power and high speed SRAM.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A memory apparatus, comprising:

a memory array arranged in columns and rows;

a plurality of word lines connected to the rows of the memory array;

a plurality of bit lines connected to the columns of the memory array;

a word line decoder connected to the word lines for selecting one of the word lines;

an equalizer connected to the bit lines for equalizing the bit lines to a desired voltage; and an equalization control apparatus for monitoring the equalizer to disable the word line decoder when the equalizer performs an equalization operation, and enable the word line decoder when the equalization operation is completed.

2. The apparatus as claimed in claim 1, wherein the memory apparatus further comprises:

an address transition detection circuit for detecting toggling of an address to generate, when a bit of the address changes, an address transition detection signal; and a bit line equalizing initialization circuit, generating an equalization turn-on signal according to the address transition detection signal to allow the equalizer to perform the equalization operation;

wherein the equalization control apparatus disables the word line decoder according to the equalization turn-on signal.

3. The apparatus as claimed in claim 2, wherein the equalization control apparatus further comprises:

a reference bit line;

a reference bit line equalization circuit for performing the equalization operation according to the equalization turn-on signal, to equalize the reference bit line to the desired voltage; and a signal generating circuit for generating a signal to enable the word line decoder when the reference bit line reaches the desired voltage.

4. The apparatus as claimed in claim 3, wherein the reference bit line equalization apparatus is a buffer bit line.

5. The apparatus as claimed in claim 3, wherein the desired voltage is a relative high voltage and a default voltage level of the reference bit line is a relative low voltage.

6. The apparatus as claimed in claim 3, wherein the desired voltage is a relative low voltage and a default voltage level of the reference bit line is a relative high voltage.

7. The apparatus as claimed in claim 1, wherein the memory array is divided into a plurality of sections.

8. The apparatus as claimed in claim 7, wherein the word line decoder is used to decode a word line address of the address, the word line address is divided into high bit part and low bit part, further comprises:

a main word line decoder for decoding the high bit part to generate a main word line signal;

a sub-word line pre-decoder for decoding the low bit part in selected section; and a plurality of sub-word line decoders connected to the sections;

wherein a sub-word line decoder corresponded by a selected section triggers a corresponding word line in the selected section according to the word line signal.

9. The apparatus as claimed in claim 7, wherein, when the equalizer performs equalization, the equalization control apparatus disables the sub-word line pre-decoder.

10. The apparatus as claimed in claim 1, the apparatus is applied in read and write cycle of static random access memory.

11. The apparatus as claimed in claim 1, the apparatus is used in synchronous SRAM, asynchronous SRAM, high-speed SRAM, or low-power SRAM.

12. A method for controlling a memory apparatus, the apparatus comprises:

a memory array arranged in columns and rows;

a plurality of word lines connected to the column of the memory array;

a plurality of bit lines connected to the rows of the memory array;

a word line decoder connected to the word lines for selecting one of the word lines; and an equalizer connected to the bit lines for equalizing the bit lines to a desired voltage;

the method comprises the step of monitoring the equalizer to disable the word line decoder when the equalizer performs equalization operation and to enable the word line decoder when the equalization operation is completed.

13. The method as claimed in claim 12, the method is applied to the read and write cycle of SRAM.

14. The method as claimed in claim 12, wherein the step of monitoring is monitoring a reference bit line equalized at the same time as that the equalizer is equalizing the bit lines.

15. The method as claimed in claim 14, wherein the reference bit line is a buffer bit line.

* * * * *